(12) United States Patent
Strassburg et al.

(10) Patent No.: US 7,238,974 B2
(45) Date of Patent: Jul. 3, 2007

(54) SEMICONDUCTOR DEVICE AND METHOD OF PRODUCING A SEMICONDUCTOR DEVICE

(75) Inventors: Matthias Strassburg, Dresden (DE); Stephan Riedel, Dresden (DE)

(73) Assignee: Infineon Technologies AG, Munich (DE)

( * ) Notice: Subject to any disclaimer, the term of this patent is extended or adjusted under 35 U.S.C. 154(b) by 6 days.

(21) Appl. No.: 10/978,216

(22) Filed: Oct. 29, 2004

(65) Prior Publication Data
US 2006/0091424 A1    May 4, 2006

(51) Int. Cl.
*H01L 29/788* (2006.01)
(52) U.S. Cl. .................. 257/208; 257/209; 257/315
(58) Field of Classification Search ................ 257/208, 257/209, 315
See application file for complete search history.

(56) References Cited

U.S. PATENT DOCUMENTS

| | | | |
|---|---|---|---|
| 6,011,725 A | 1/2000 | Eitan | |
| 6,358,864 B1* | 3/2002 | Chang et al. | 438/763 |
| 6,498,084 B2* | 12/2002 | Bergemont | 438/593 |
| 6,642,586 B2 | 11/2003 | Takahashi | |
| 6,740,605 B1 | 5/2004 | Shiraiwa et al. | |
| 6,756,271 B1 | 6/2004 | Satoh et al. | |
| 6,927,133 B2 | 8/2005 | Takahashi | |
| 6,962,842 B1* | 11/2005 | Kalnitsky et al. | 438/202 |
| 2002/0168843 A1* | 11/2002 | Bergemont | 438/593 |
| 2003/0219944 A1 | 11/2003 | Kato et al. | |
| 2003/0235952 A1 | 12/2003 | Shibata | |
| 2004/0028733 A1 | 2/2004 | Tomiie et al. | |
| 2004/0048433 A1 | 3/2004 | Takahashi | |
| 2006/0091424 A1* | 5/2006 | Strassburg et al. | 257/208 |
| 2006/0131672 A1* | 6/2006 | Wang et al. | 257/410 |

FOREIGN PATENT DOCUMENTS

| | | |
|---|---|---|
| EP | 1 231 646 A2 | 8/2002 |
| EP | 1231646 A2 * | 8/2002 |
| WO | WO 01/17030 A1 | 3/2001 |

OTHER PUBLICATIONS

Eitan, B., et al., "NROM: A Novel Localized Trapping, 2-Bit Nonvolatile Memory Cell," IEEE Electron Device Letters, Nov. 2000, pp. 543-545, vol. 21, No. 11.

(Continued)

*Primary Examiner*—Laura M. Schillinger
(74) *Attorney, Agent, or Firm*—Slater & Matsil, L.L.P.

(57) ABSTRACT

A semiconductor device comprises a memory cell (160) including a transistor body (150) having a top surface (111) and including a first doping area (10*a*) and a second doping area (10*b*) with a channel region (110) in between. The memory cell (160) further includes a gate electrode (3*a*) arranged above the channel region (110) and separated therefrom by a dielectric layer (2*a*). An oxide-nitride-oxide layer (66) has first portions (661) and second portions (662). The first portions (661) of the oxide-nitride-oxide layer (66) are arranged above at least parts of the first and second doping areas (10*a*, 10*b*) and are substantially parallel to the top surface (111) of the transistor body (150). The second portions (662) of the oxide-nitride-oxide layer (66) are adjacent to the gate electrode (3*a*) and extend in a direction not substantially parallel to the top surface (111) of the transistor body (150).

31 Claims, 9 Drawing Sheets

OTHER PUBLICATIONS

Kang, S.T., et al., "A Study of SONOS Nonvolatile Memory Cell Controlled Structurally by Localizing Charge-Trapping Layer," Proc. IEEE Non-Volatile Memory Workshop, Monterey, 2003, pp. 39-41.

Shappir, J., et al., "Split Nitride NROM in 0.09u Generation," Aug. 12, 2002, Saifun Semiconductors Ltd., 14 Seiten, pp. 1-14.

Tsai, W.J., et al., "Novel PHINES Flash EEPROM with 0.046um$^2$ Bit Size for Giga-bit Era Application," Technology Development Center, Macronix International Co., Ltd, (4 pages).

* cited by examiner

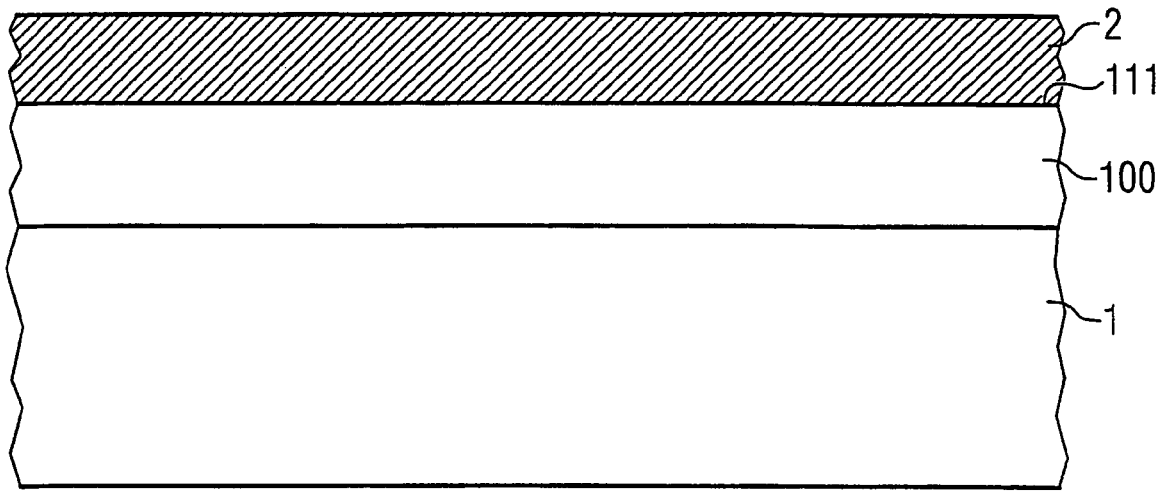
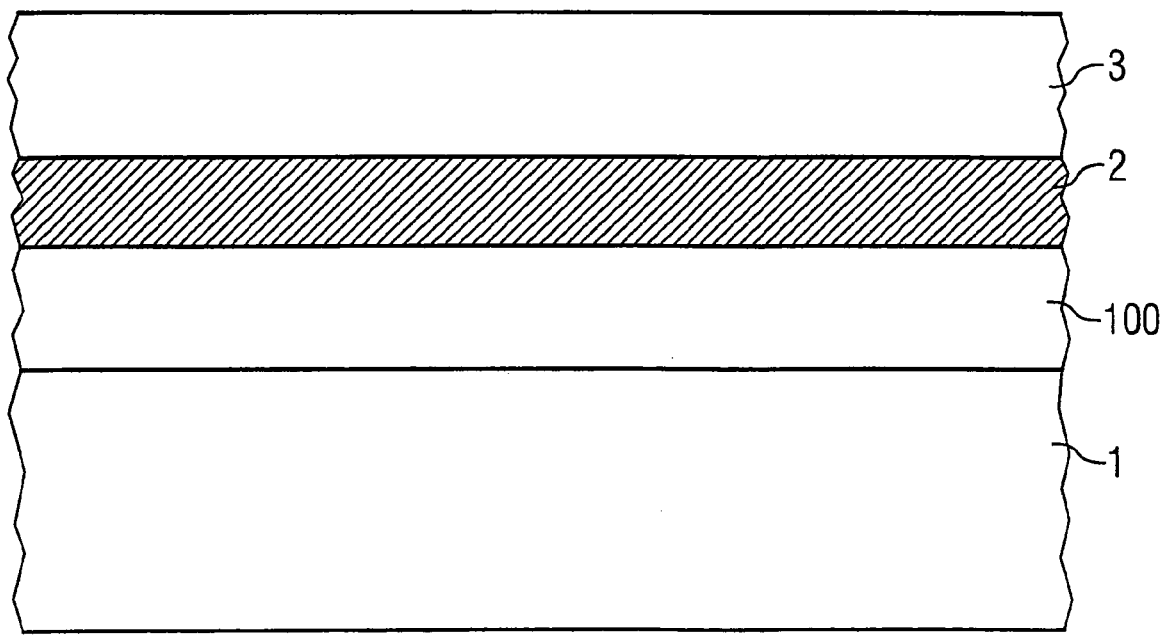

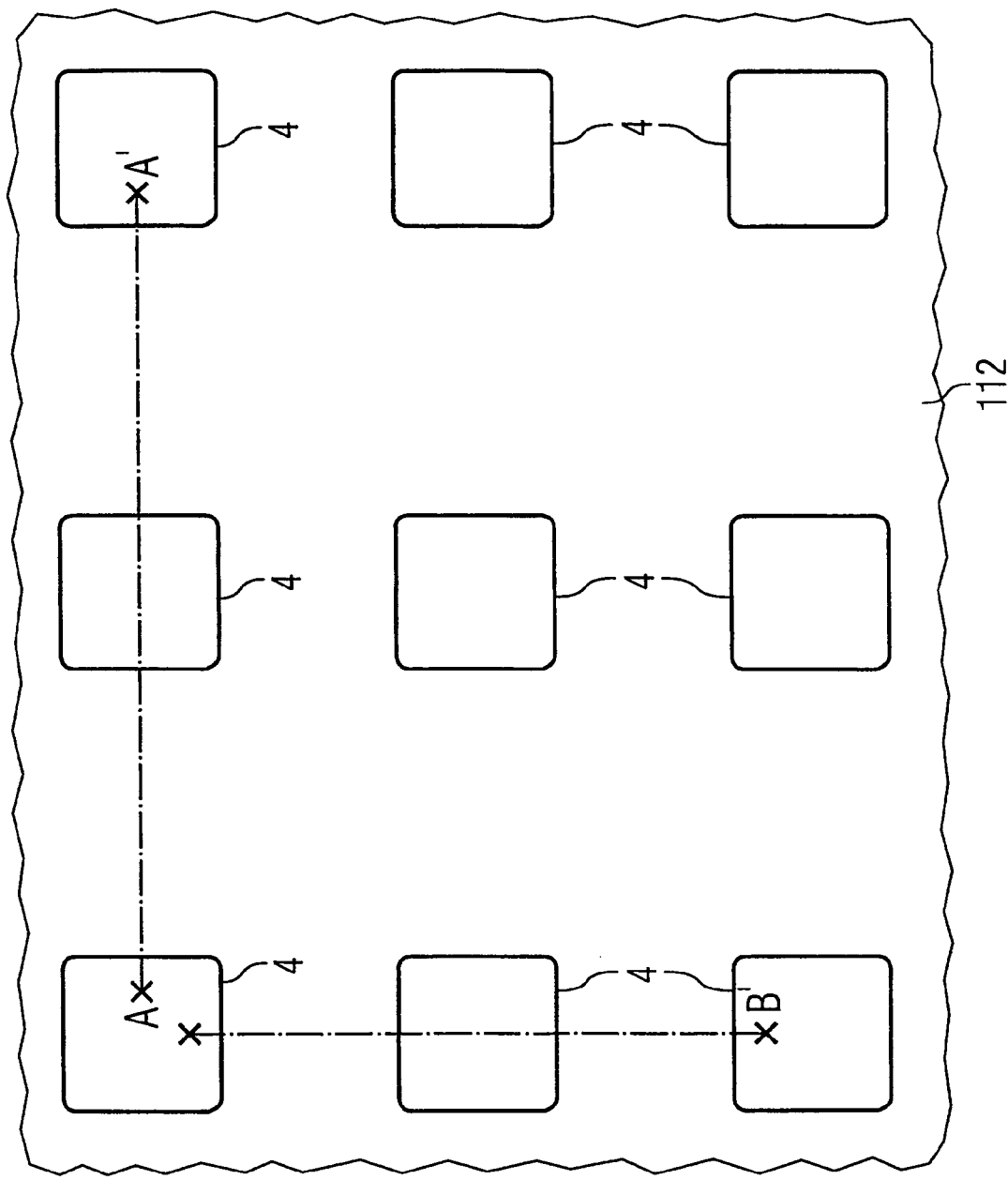

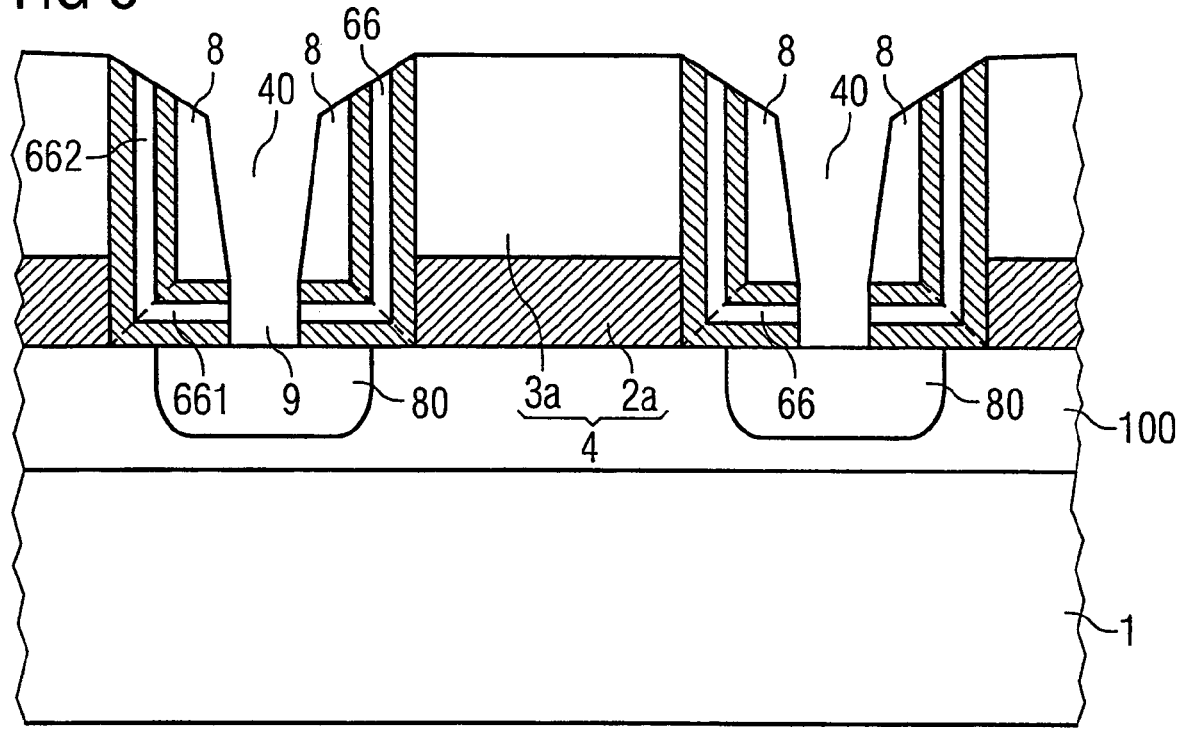
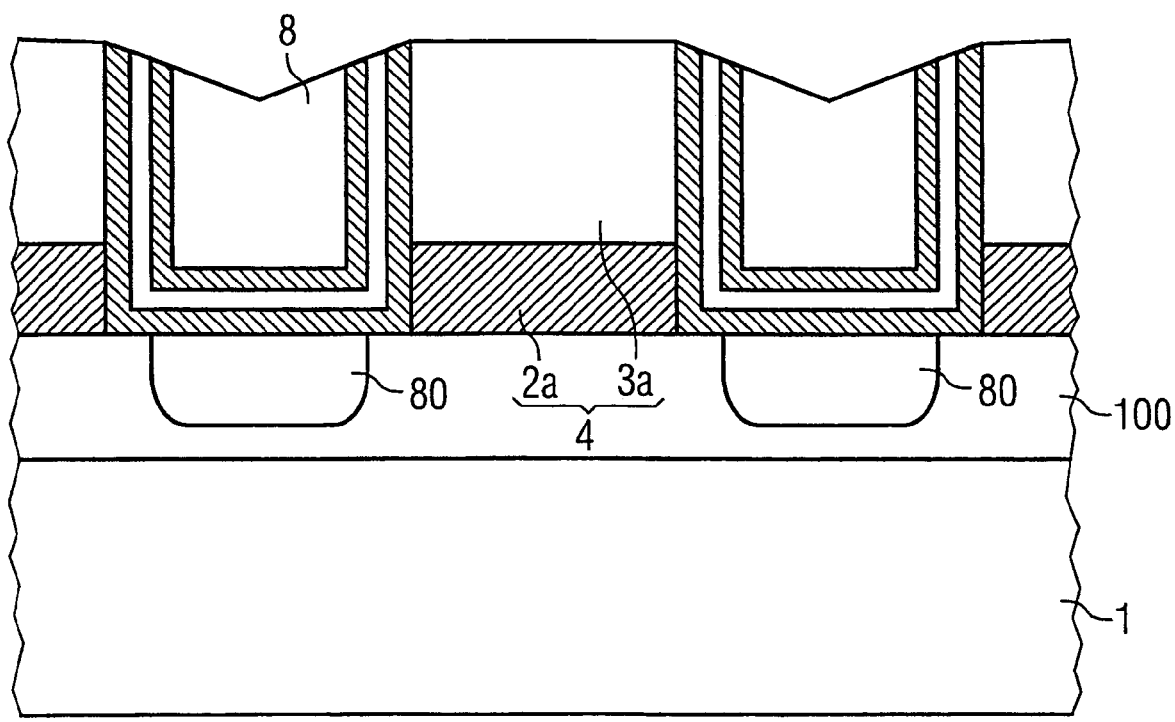

SEMICONDUCTOR DEVICE AND METHOD OF PRODUCING A SEMICONDUCTOR DEVICE

TECHNICAL FIELD

The present invention generally relates to a semiconductor memory device, more particularly to a multi-bit memory cell having a transistor body and an oxide-nitride-oxide layer, and further concerns a method of producing such a semiconductor memory device.

BACKGROUND

Portable devices, such as mobile phones, digital cameras and music players, comprise non-volatile memory units. These portable devices have become smaller in recent years, as have the respective memory units. It is assumed that the miniaturization of portable devices will proceed. The amount of data that can be stored in the non-volatile memory unit may increase to improve the performance of the device. As a result, for example, more music songs, photos or other data can be stored in smaller devices.

Non-volatile memory units may be realized in different ways. Examples are read-only memory (ROM), programmable read-only memory (PROM), erasable programmable read-only memory (EPROM) and electrical erasable programmable read-only memory (EEPROM).

The advantage of the ROM is the low price per device. The ROM cannot be programmed electrically. Programming occurs during one of the production steps. Special masks that contain the data to be stored pattern the semiconductor device according to the data. When the production process has been completed, the content of the ROM can no longer be changed. Changes in data programming result in the expensive and time-consuming redesign of the special masks.

The PROM is manufactured as a blank memory. After having been programmed once, the content cannot be changed anymore.

The EPROM can be programmed again after having been exposed to ultraviolet light for erasing.

The above-described non-volatile memory unit cannot be electrically erased. The EEPROM can be electrically programmed and erased. It retains the stored data for a long time without power supply and can easily be programmed and erased many times.

The EEPROM comprises a plurality of memory cells for storing small pieces of information. There are memory cells for storing only one bit. Multi-bit memory cells, however, can store more than one bit. Means for storing a bit have two states. One state represents a logic zero. The other state represents a logic one.

An embodiment of a one-bit memory cell comprises a transistor body that includes a cell well having two doping areas. A channel region is located between the doping areas. A gate electrode is arranged above the channel region insulated by a dielectric layer that is arranged between the channel region and the gate electrode.

The cell well is formed by implanting ions into the substrate. The doping areas are formed by implanting ions in a further step. The type of the dopant ions used to form the doping areas differs from the type of the dopant ions used to form the cell well.

One of the doping areas serves as a source and the other one serves as a drain. A reading voltage is applied to the drain while the source is grounded. If the reading voltage exceeds a certain threshold voltage, a current flows. In accordance with the respective state, the threshold voltage varies. It is either higher or lower than the reading voltage. An alternative embodiment of a memory cell based on this structure is described below.

A non-volatile memory cell comprises a transistor as described above including a gate electrode arranged above a dielectric comprising a first oxide layer, a silicon nitride layer and a second oxide layer. The silicon nitride layer is used to trap electrons. Applying a positive gate voltage, electrons can tunnel from the substrate through the thin oxide layer, where they are subsequently trapped. The trapped negative charge increases the threshold voltage of the transistor. Likewise, the threshold voltage can be decreased by a negative voltage on the gate, removing the electrons from the nitride layer. When applying the reading voltage, a current either flows or not, depending on the threshold voltage. The two stages of the memory cell correspond to a switch that is either conductive or not.

A similar memory cell, however, also comprising a silicon nitride charge trapping layer between the channel region and the gate electrode, is able to store two bits. Such a cell is called nitride programmable read only memory (NROM) cell.

The nitride programmable read only memory (NROM) cell is described in U.S. Pat. No. 6,011,725 and Boaz Eitan et al.: "NROM: A Novel Localized Trapping, 2-Bit Nonvolatile Memory Cell," IEEE Electron Device Letters, vol. 21, no. 11, November 2000. Both of these references are incorporated herein by reference.

The oxide-nitride-oxide layer of the NROM cell comprises a nitride layer of the memory cell serving as a charge trapping layer sandwiched between the insulating oxide layers which avoid vertical retention. Two individual bits are stored in physically different regions of the even nitride layer. A first bit region is near a first doping area and a second bit region is near the second doping area. S. T. Kang et al.: "A Study of SONOS Nonvolatile Memory Cell Controlled Structurally by Localizing Charge-Trapping Layer," Proceedings of IEEE Non-Volatile Memory Workshop, Monterey, 2003, which is incorporated herein by reference, describes a memory cell having two segregated ONO layers.

A memory cell array includes a plurality of memory cells arranged as a matrix having rows and columns. The rows of the cell array are arranged parallel to a first direction. The columns of the cell array are arranged parallel to a second direction that is orthogonal with respect to the first direction. The first and second doping areas of the memory cells in a column are aligned in a direction parallel to the second direction.

The gate electrodes arranged parallel to the first direction are connected to wordlines. A bitline connects the doping areas arranged parallel to the second direction. The bitline includes the sources and drains of the memory cells located on either side.

The bits are programmed by means of channel hot electron programming. Electrons are injected from the channel into the charge trapping region, according to the applied voltages. Programming of a first bit is performed by applying a programming voltage to the first doping area and the gate while grounding the second doping area. The electrons are injected and trapped in the first bit region, which is adjacent to the first doping area. Likewise, programming of a second bit is performed by applying a programming voltage to the second doping area and the gate while grounding the first doping area. The electrons are injected and trapped in the second bit region.

For erasing a bit, hot holes or Fowler-Nordheim tunneling can be used. Erasing of the first bit is performed by applying erasing voltages to the gate or to the first doping area and the gate resulting in a lateral field. Holes are caused to flow through the bottom oxide layer for compensating the charge of the electrons.

A bit information is read by applying a reverse voltage between the first and second doping area compared to the programming voltage that is used to program the bit. Relatively small charges near the grounded one of the first and second doping areas prevent or reduce current flow. For example, reading of the first bit is performed by applying reading voltages to the second doping area and the gate. The first doping area is grounded. The current flows, while there are no trapped charges inside the first bit region. While there are trapped charges inside the first bit region, the current flow is reduced or the current does not flow.

The first and second bit of each memory cell can be programmed, read and erased by applying the programming, reading and erasing voltage respectively to the adjusted combination of the bitlines and the wordline, which are connected with the respective memory cell.

A conventional NROM cell as described above comprises an even oxide-nitride-oxide layer beneath the gate having two different regions for storing the charges representing the first and second bit information. As a result, the injection of electrons or holes for changing one bit information can influence the other bit. The influence of residual charges in a region of the nitride layer located adjacent to the bitline may be negligible. An unintended injection into the nitride layer of state-of-the-art NROM cells above the channel region cannot be avoided.

The local distribution of electrons in the charge trapping region is wider than for holes, because the mobility of electrons and holes in nitride differs. Holes are much more mobile. The same number of holes is spread in a wider area than the corresponding number of electrons. There is not a hole adjacent to each electron compensating its charge. More widely spread holes than electrons are used to cover the charge of the electrons. In order to change a bit information that is represented by electrons, more holes are injected to compensate the charge of the electrons. During a further programming step, more electrons may be injected into the charge trapping region again, requiring more holes to compensate the charge during the following erase cycle. This aging process results in an increase of the erasing voltages and the programming and erasing processes take more time.

The enhanced mobility of the holes representing one bit influences the charges representing the other bit and result in a retention loss.

SUMMARY OF THE INVENTION

In one aspect, the invention provides a semiconductor device that overcomes the above-mentioned disadvantages of the prior art device, in particular aging due to the different degrees of mobility of electrons and holes.

In a further aspect, the present invention provides a memory cell having separated charge-trapping regions for storing charges representing a first and a second bit, respectively.

In a first embodiment, the invention comprises a memory cell including a transistor body having a top surface and further including a first doping area and a second doping area with a channel region in between. The memory cell further includes a gate electrode arranged above the channel region and separated therefrom by a dielectric layer. The memory cell also includes an oxide-nitride-oxide layer having first portions and second portions. The first portions of the oxide-nitride-oxide layer are arranged above at least parts of the first and second doping areas and are substantially parallel to the top surface of the transistor body. The second portions of the oxide-nitride-oxide layer are adjacent to the gate electrode and extend in a direction that is not substantially parallel to the top surface of the transistor body.

In another embodiment, the second portions of the oxide-nitride-oxide layer are substantially orthogonal with respect to the first portions of the oxide-nitride-oxide layer and are in contact with sidewalls of the gate electrode. The first portions of the oxide-nitride-oxide layer are in contact with the top surface of the transistor body. Due to the shape of the oxide-nitride-oxide layer, there are corner regions of the sandwiched nitride layer that are adjacent to the first or second doping area and the gate electrode. There is one corner region on either side of the gate electrode serving as a charge-trapping region.

The inventive cell provides a very good two-bit segregation since there is no direct nitride connection between the charge-trapping regions. Due to the L-shaped oxide-nitride-oxide layer, a good alignment of charge carriers is provided for. The charge carriers are trapped in the edge region. The extension of the charge carriers, especially holes, into the channel region or along the area located beneath the gate electrode is mitigated.

In yet a further embodiment, the semiconductor device comprises a plurality of gate electrodes being arranged on the top surface of a substrate. The gate electrodes are arranged as an array having rows located parallel to a first direction and columns located parallel to a second direction that is orthogonal with respect to the first direction. Each gate electrode is separated from the substrate by a gate dielectric. Bitlines are arranged parallel to the second direction between adjacent rows of gate electrodes and beneath the top surface of the substrate. At least one channel region is located between adjacent bitlines and beneath a gate electrode. The semiconductor device further comprises an oxide-nitride-oxide layer that has first portions and second portions. The first portions of the oxide-nitride-oxide layer are arranged above the top surface and are substantially parallel to the top surface of the substrate. The second portions of the oxide-nitride-oxide layer are adjacent to the gate electrode and extend in a direction not substantially parallel to the top surface of the substrate.

In particular, the second portions of the oxide-nitride-oxide layer are substantially orthogonal with respect to the first portions of the oxide-nitride-oxide layer. A bottom surface of the second portions of the oxide-nitride-oxide layer is in contact with sidewalls of the gate electrodes. The bottom surface of the first portions of the oxide-nitride-oxide layer is in contact with the top surface of the substrate. The gate electrodes are insulated by a vertical nitride layer forming a nitride spacer that is located on sidewalls of the gate electrodes. The gate electrodes arranged in a row are connected with a wordline.

A memory cell of the array is programmed, read or erased by applying corresponding drive voltages to the bitlines and the wordline that are connected with the respective memory cell.

The inventive memory cell and the respective memory cell array provide for a good alignment of charge carriers in the oxide-nitride-oxide layer mitigating the problem of different degrees of mobility of electrons and holes in nitride.

An inventive embodiment for producing the semiconductor device is also described. A semiconductor substrate with a top surface is provided. An oxide layer is applied onto the substrate. Dopant ions are introduced into the top surface of the substrate to form a cell well. A polysilicon layer is applied onto the oxide layer. The polysilicon layer and the oxide layer are partially etched to form a gate island. As a result, the top surface of the semiconductor is exposed. An oxide-nitride-oxide layer is applied onto the exposed top surface of the semiconductor substrate and the top surface and sidewalls of the gate island. The method further comprises the steps of applying a nitride layer onto the oxide-nitride-oxide layer to form horizontal and vertical portions of the nitride layer. Horizontal portions of the nitride layer and the oxide-nitride-oxide layer located beneath are etched to form a nitride spacer. Due to the etching process, the top surface of the substrate between columns of gate islands is exposed. Dopant ions are introduced into the exposed surface of the substrate to form a bitline. An oxide line is applied onto the bitline for insulation. In a further step, a wordline is formed to connect the gate electrodes that are arranged in a row.

These and other features and advantages of the invention will become apparent from the following brief description of the drawings, detailed description and appended claims and drafts.

BRIEF DESCRIPTION OF THE DRAWINGS

For a more complete understanding of the present invention and its advantages, reference is now made to the following descriptions taken in conjunction with the accompanying drawings, in which:

FIG. 1 shows a cross-section of an intermediate product of a preferred production method after introducing dopant ions and applying an oxide layer onto a semiconductor substrate;

FIG. 2 shows a cross-section according to FIG. 1 including a polysilicon layer on the surface of the oxide layer;

FIG. 4 shows an intermediate product of the preferred method in the top view;

FIG. 8 shows a cross-section according to FIG. 6 after strong over-etching to remove horizontal portions of the nitride layer and the oxide-nitride-oxide layer beneath;

FIG. 9 shows a cross-section according to FIG. 7 after strong over-etching to remove the horizontal portions of the nitride layer and the oxide-nitride-oxide layer beneath;

Figure 3:
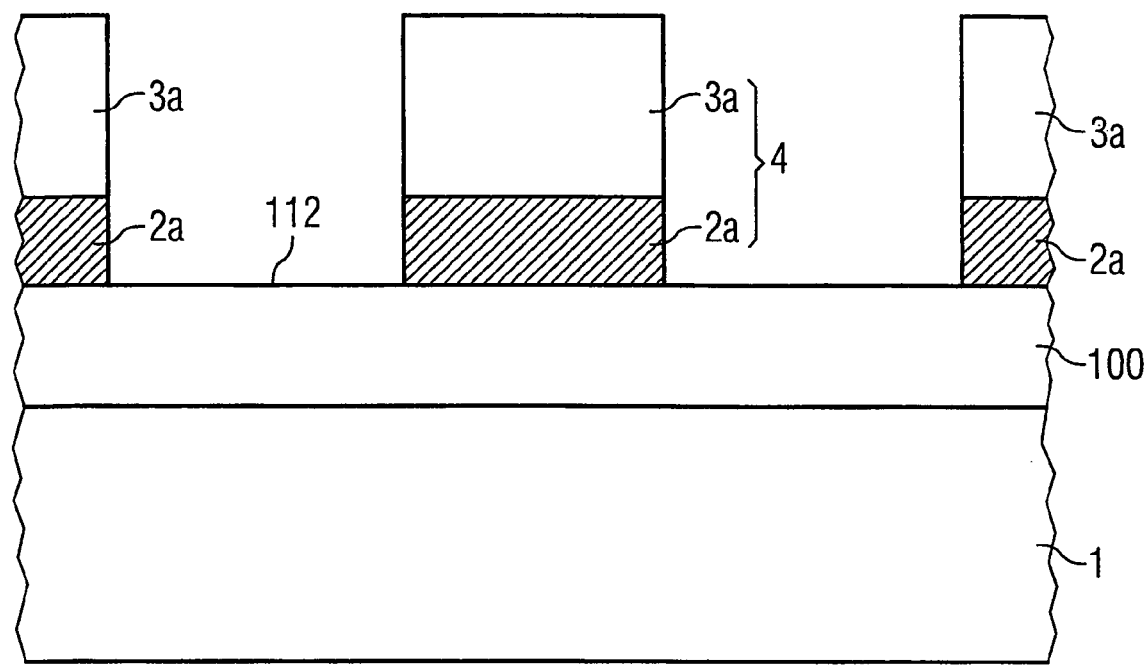
FIG. 3 shows a cross-section according to FIG. 2 after etching gate islands.

The following list of reference symbols can be used in conjunction with the figures:

| 1 | substrate | 606 | corner of the |
| 100 | cell well | | nitride layer |
| 111 | top surface | 8 | nitride spacer |
| 112 | exposed top surface | 88 | nitride layer |
| 2 | oxide layer | 88a | horizontal portions |
| 3 | polysilicon layer | | of nitride layer |
| 2a | gate dielectric | 88b | vertical portions |
| 3a | gate electrode | | of nitride layer |
| 4 | gate island | 9 | gap |
| 33 | sidewalls of gate island | 10 | bitline |
| 5 | bottom oxide layer | 10a | first doping area |
| 6 | nitride layer | 10b | second doping area |
| 7 | top oxide layer | 110 | channel region |
| 66 | oxide-nitride-oxide layer | 120 | junction area |
| 661 | horizontal portions of oxide-nitride-oxide layer | 11 | oxide line |
| | | 12 | residual oxide layer |
| | | 13 | wordline |
| 662 | vertical portions of oxide-nitride-oxide layer | 14 | cap nitride layer |
| | | 40 | trench |
| | | 80 | anti-punch implant |
| 51 | bottom surface of horizontal portions of oxide-nitride-oxide layer | 150 | transistor body |
| | | 160 | memory cell |
| | | 301 | first direction |
| 52 | bottom surface of vertical portions of oxide-nitride-oxide layer | 302 | second direction |
| | | C1 | first charge-trapping region |
| 77 | top surface of oxide-nitride-oxide layer | | |
| | | C2 | second charge-trapping region |
| 507 | corner of oxide-nitride-oxide layer | | |

DETAILED DESCRIPTION OF ILLUSTRATIVE EMBODIMENTS

Preferred embodiments are discussed in detail below. It should be noted, though, that the present invention provides many applicable concepts that can be embodied in a wide variety of specific contexts. The specific embodiments discussed are merely illustrative of specific ways to make and use the invention and do not limit the scope of the invention.

A production process of a semiconductor device comprises a plurality of steps to form patterned layers onto or into a substrate, which is in general monocrystalline silicon. A first embodiment production process of an inventive memory cell is described below and illustrated in FIGS. 1 to 14. These figures show cross-sections and top views of a small region of intermediate products of a semiconductor memory device.

FIG. 1 shows a cross-section of a region of an intermediate product of a semiconductor device. A semiconductor (e.g., silicon) substrate 1 is provided. A top surface 111 of the semiconductor substrate 1 is covered by an oxide layer 2. The thickness of the oxide layer 2 is preferably in the range of about 5 nm to 30 nm. In particular, the step of depositing the oxide layer 2 generally includes thermal oxidation to form the oxide layer 2 (e.g., silicon dioxide) onto the substrate 1.

The following step includes forming a cell well 100 by introducing dopant ions resulting in an homogeneous doping of a top region of the semiconductor substrate 1. The dopant ions are implanted through the oxide layer 2. In a preferred embodiment of the invention, p-type impurities such as boron or indium ions are used as dopant ions.

It is also possible to implant the dopant ions into the semiconductor substrate 1 prior to the step of depositing the oxide layer 2. Using this sequence of processing steps the oxidation process may change the doping. As a result, the concentration of dopant ions in the cell well 100 may become inhomogeneous.

FIG. 2 shows a cross-section according to FIG. 1 after a further processing step. A polysilicon layer 3 is deposited on the oxide layer 2. The polysilicon layer 3 and the cell well 100 are insulated from the polysilicon layer 3 by the oxide layer 2.

FIG. 3 shows the region according to FIG. 2 after a further processing step.

In general, a memory unit comprises a plurality of memory cells arranged in an array, each memory cell having a gate electrode 3a. As a result, a plurality of gate islands 4 according to the arrangement of memory cells is formed during an etching process.

Parts of the polysilicon layer 3 and the oxide layer 2, which is located beneath, are etched to form the gate island 4. The gate island 4 comprises a gate electrode 3a and an insulating gate dielectric 2a. The top surface 112 of the semiconductor substrate 1 is exposed because of the etching process. A typical etching process, for example, comprises the steps of forming a mask on a top surface of the polysilicon layer 3, etching relative to the mask and removing the mask.

FIG. 4 shows a top view of the gate islands 4. The gate islands 4 are arranged as an array having rows and columns. The rows of gate islands 4 are located parallel to a first direction 301. The columns of gate islands 4 are located parallel to a second direction 302 orthogonal with respect to the first direction 301.

The distance between adjacent rows of the gate islands 4 is smaller than the distance of adjacent columns of the gate islands 4, since, in a further step, which is described below, bitlines 10 are formed in between. As a result, further processing steps result in different structures along the first and second directions 301, 302. The respective structures are shown in the following figures. FIGS. 6, 8 and 10 to 13 show cross-sections of memory cells arranged along a line between A and A', which is located parallel to the first direction 301. FIGS. 7 and 9 show cross-sections of memory cells arranged along the line between B and B', which is located parallel to the second direction 302.

Figure 5:
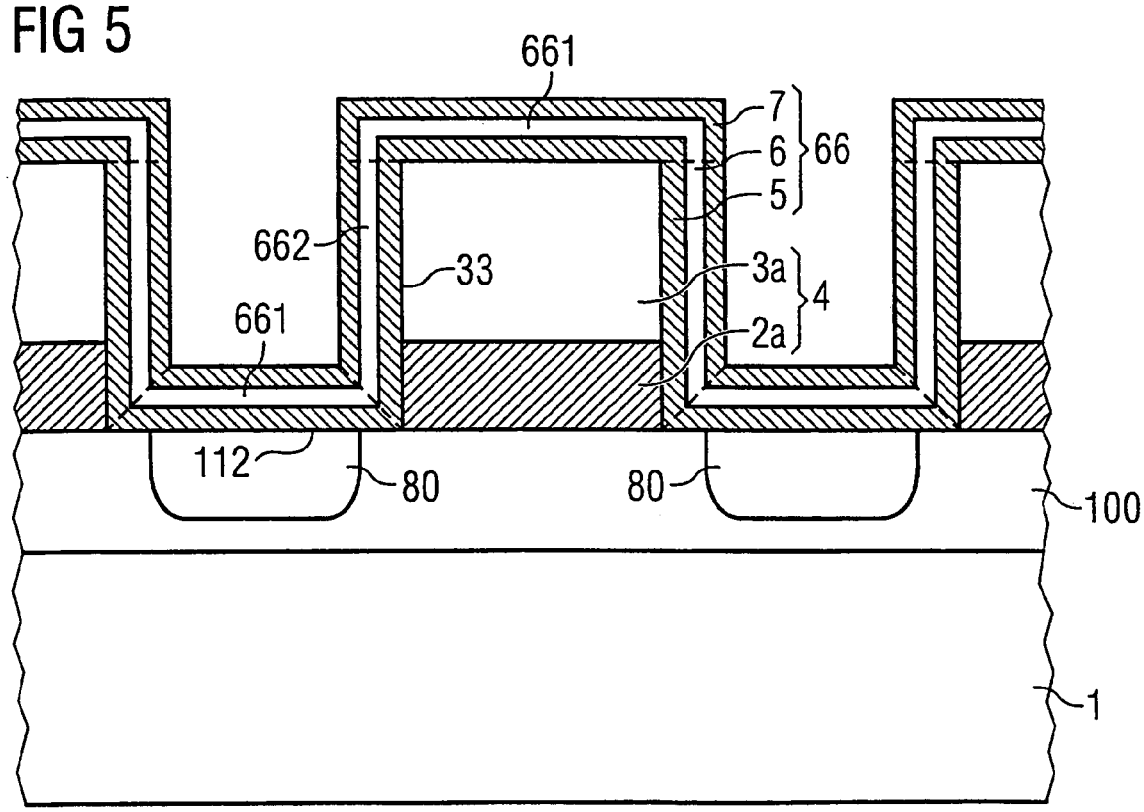
FIG. 5 shows a cross-section according to FIG. 3 overlaid by an oxide-nitride-oxide layer.

FIG. 5 shows the region according to FIG. 3 after a further processing step. An oxide-nitride-oxide (ONO) layer 66 is applied onto the exposed surface 112 of the semiconductor substrate 1 and the top surface and sidewalls 33 of the gate islands 4. The ONO layer 66 includes a nitride layer 6 (e.g. silicon nitride) that is sandwiched between an oxide layer (e.g. silicon dioxide) on top 7 and an oxide (e.g. silicon dioxide) layer 5 below. Instead of a nitride layer, any non-conductive charge-trapping material can be used. This processing step results in the shape of the ONO layer 66 according to the invention having horizontal portions 661 on top of the gate islands 4 and in between and vertical portions 662 that are arranged on the sidewalls 33 of the gate islands 4.

An optional step comprises inserting dopant ions to form a dopant, in particular an implant 80, having anti-punch characteristics and serving as a diffusion barrier and for insulation of the gate electrodes 3a. The implant 80 is introduced through the ONO layer into the substrate. The dopant ions are not able to tunnel the gate islands 4 resulting in the lack of anti-punch implant 80 beneath the gate islands 4. Preferably indium ions are used. Indium ions are larger and less mobile than boron ions. As a result, the diffusion of the implanted ions is reduced during further steps, in particular steps comprising an increased temperature used to activate an implantation. Although the anti-punch implant 80 is arranged between the rows and the columns of the gate islands 4, it is particularly used to insulate adjacent rows of gate electrodes 3a, since the distance in between is smaller than the distance between adjacent columns of gate electrodes 3a.

Figure 6:
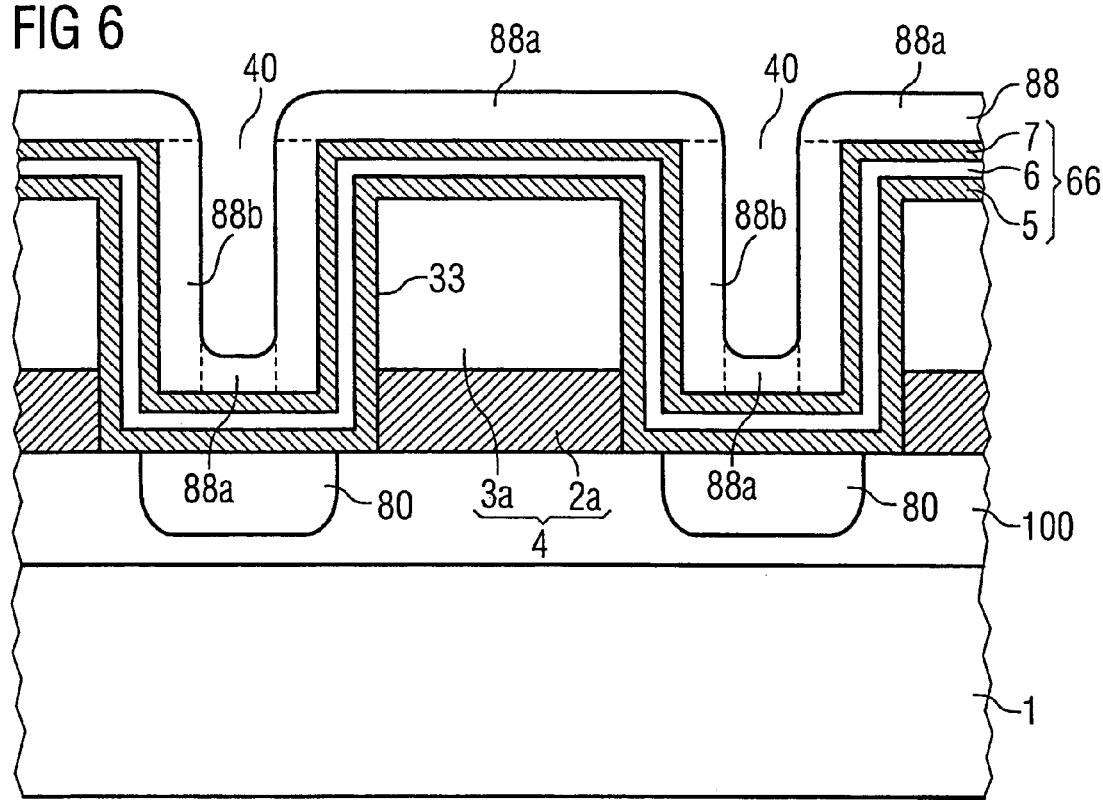
FIG. 6 shows a cross-section according to FIG. 5 along a line AA' shown in FIG. 4 after applying a nitride layer.
Figure 7:
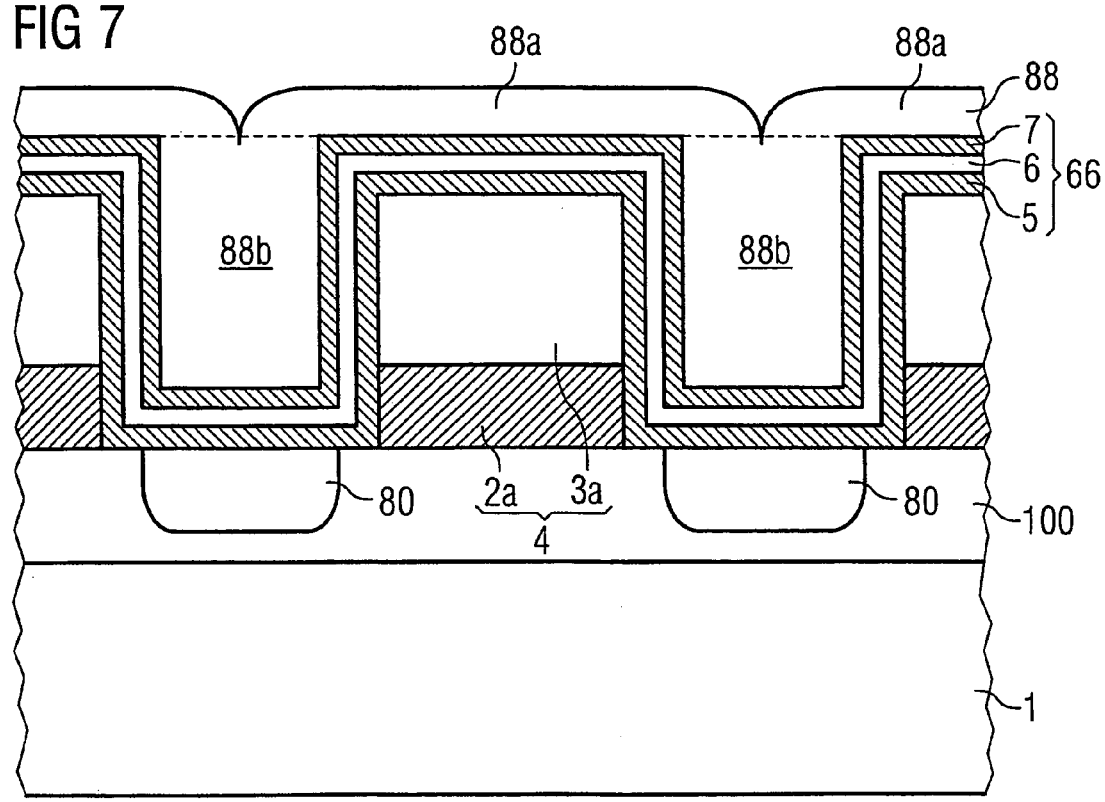
FIG. 7 shows a cross-section of the intermediate product according to FIG. 6 along a line BB' shown in FIG. 4.

FIG. 6 shows a region according to FIG. 5 and along line AA', which is located parallel to the first direction 301, after a further processing step. A nitride layer 88 is applied onto the ONO layer 66 forming horizontal portions 88a and vertical portions 88b. The vertical portions 88b of the nitride layer 88 form sidewalls of trenches 40 located between adjacent gate islands. The horizontal portions 88a of the nitride layer 88 located between the gate islands 4 form the bottom walls of the trenches 40.

FIG. 7 shows a region along line BB', which is orientated parallel to the second direction 302, after the same processing step. The distance of the gate islands 4 arranged along line BB' is smaller than along line AA'.

The nitride layer 88 is applied onto the ONO layer 66. The thickness of the nitride layer 88 is severely adjusted to fill the entire space between the adjacent gate islands 4. The cross-section of the nitride layer 88 looks comb-shaped having horizontal portions 88a above the top surface of the gate islands 4 and vertical portions 88b in between. There are no trenches between adjacent gate islands 4 arranged along line BB'. Due to the difference between the distance of columns and the distance of rows of the gate islands 4, trenches 40 are located only parallel to the second direction 302.

The vertical portions 88b of the nitride layer 88 serve as a means of insulating the gate islands 4 of the respective memory cells and stop the diffusion of the implanted ions. The distance between the gate islands 4 has to be adjusted severally. On the one hand, the distance between the gate islands 4 may be small. On the other hand, the thickness of the nitride layer 88, which fills the entire space between adjacent rows of gate islands 4, must have the ability to reduce the diffusion of dopant ions significantly and to insulate the gate electrodes 3a.

FIG. 8 shows a region parallel to the first direction 301 according to FIG. 6 after a further processing step comprising strong over-etching to remove the horizontal portions 88a of the nitride layer 88 and the ONO layer 66 located beneath. The top surface of the gate island 4 is exposed. The horizontal nitride layer 88b and the ONO layer 66 located beneath the surface of the bottom wall of the trench 40 are removed resulting in a gap 9. The gap 9 separates the horizontal portions 661 of the ONO layer 66 between two adjacent gate islands 3a. The vertical portions 88b of the nitride layer 88 remain to form a nitride spacer 8.

FIG. 9 shows a region along the second direction 302 according to FIG. 7 after the same processing step. The entirely filled space between the adjacent gate islands 4 remains to form a nitride spacer 8, which serves as a means of insulating adjacent gate electrodes 4. The etching process only removes layers on top of the gate islands 4.

Figure 10:
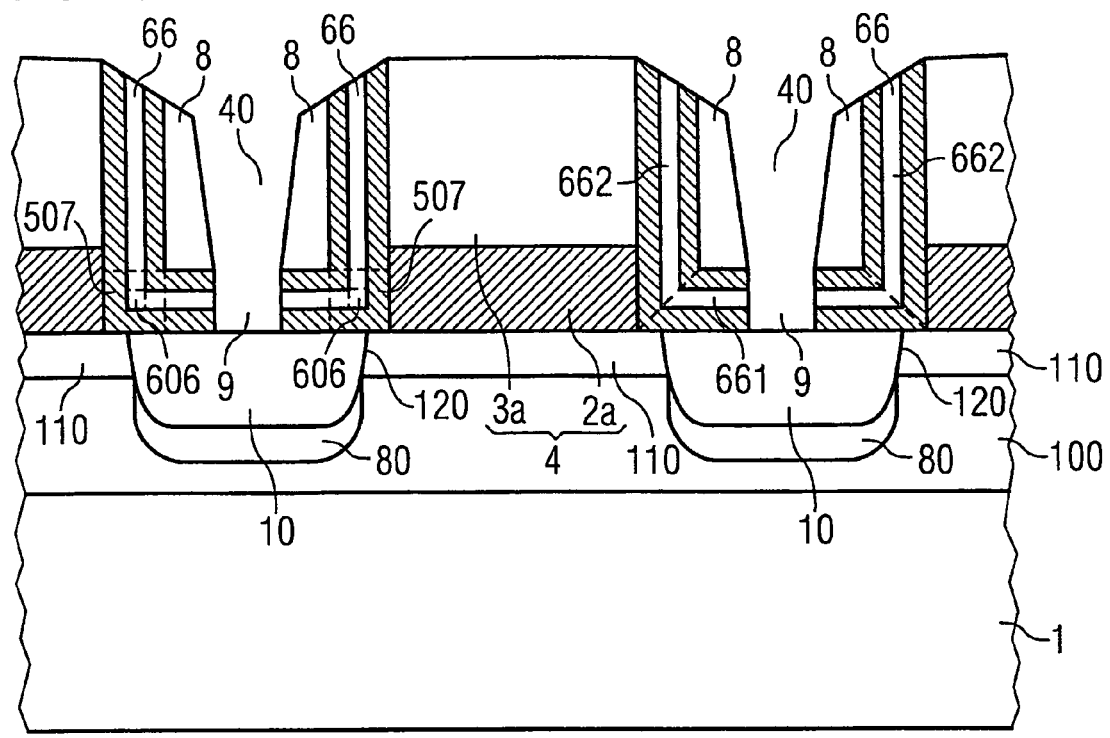
FIG. 10 shows the cross-section according to FIG. 8 after introducing dopant to form a bitline.

FIG. 10 shows a region according to FIG. 8 after a further processing step. Dopant ions are introduced through the gap 9 to form a bitline 10. The bitline 10 is arranged beneath the gap 9 and adjacent portions of the ONO layer 66. The bitline 10 is located parallel to the first direction 301 and between adjacent columns of gate islands 4.

It is not possible to inject dopant ions into the substrate 1 between adjacent rows of gate islands 4 since the nitride spacer 8 fills the entire space in between, as shown in FIG. 9. The dopant ions are stopped by the nitride spacer 8.

A channel region 110 is located beneath the gate electrode and between two bitlines 10. The channel region 110 has the same doping as the cell well 100. Horizontal portions 661 of the L-shaped ONO layer 66 are above the bitline 10. The corner 507 of the L-shaped ONO layer 66, in particular the corner 606 of the nitride layer 6, is preferably located above a junction area 120 located between the bitline 10 and the channel region 110.

The preferred embodiment of the invention comprises arsenic ions for doping. The combination of boron or indium ions for a cell well 100 and arsenic or another column IV element (e.g., phosphorus) results in an n-channel. An n-channel is preferred to a p-channel because the electrons move faster than the holes, resulting in a faster programming and erasing process of the memory cell.

After implanting, the semiconductor device is annealed at a temperature of about 1050° C. to activate the implantation.

Figure 11:
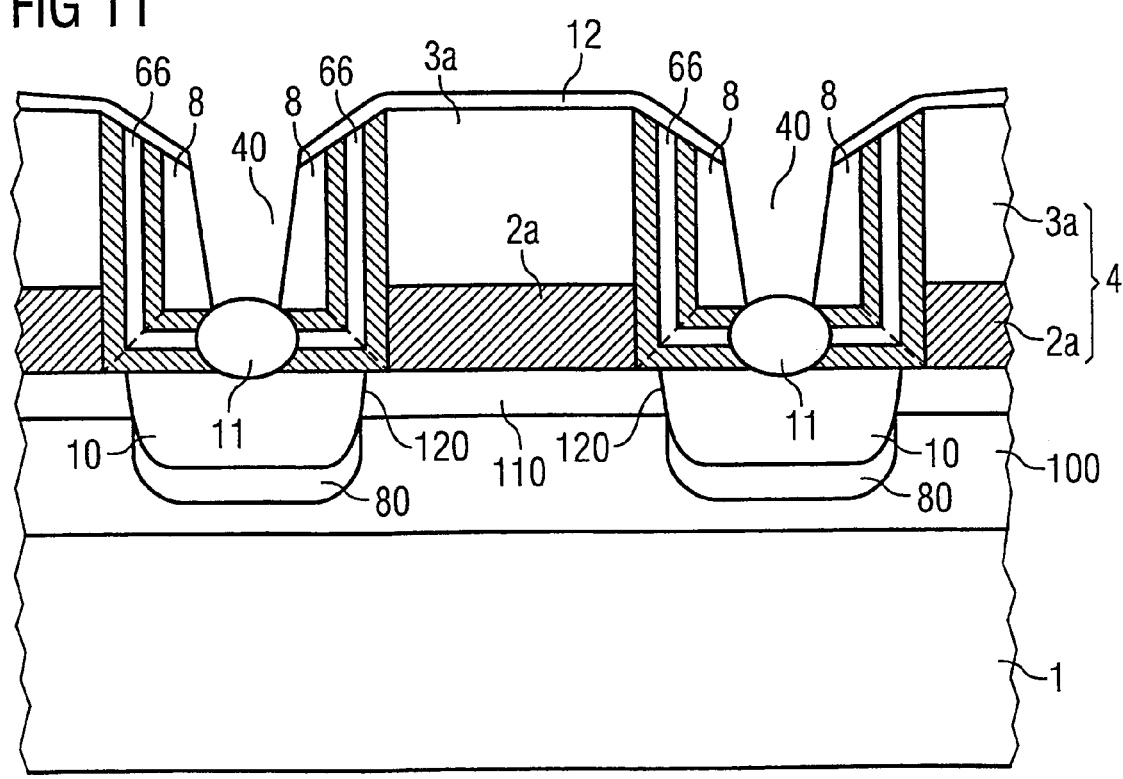
FIG. 11 shows a cross-section according to FIG. 10 after applying an oxide line the bitline.

FIG. 11 shows a region according to FIG. 10 after a further processing step. An oxide line 11 is deposited into the gap 9 above the bitline 10. The oxide line 11 separates the ONO layer 66 and insulates the bitline 10. Due to the oxidation process, a thin residual oxide layer 12 is deposited onto the top surface of the gate islands 4.

Figure 12:
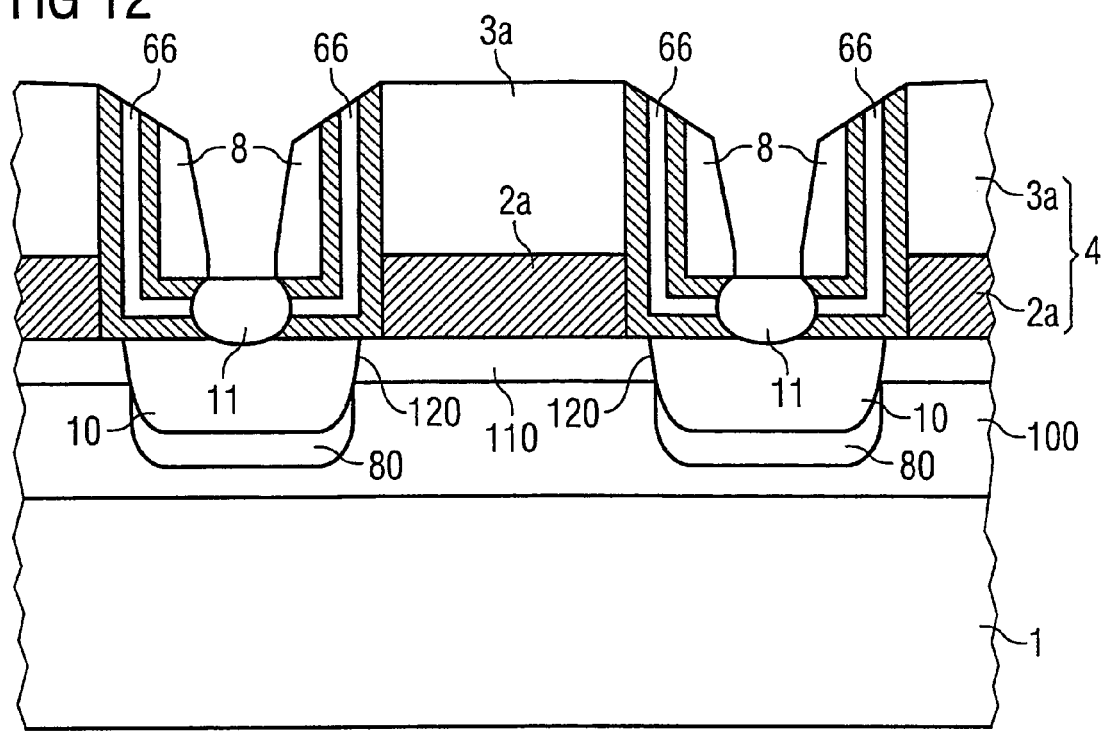
FIG. 12 shows the cross-section according to FIG. 11 after etching a residual layer off a top of the gate island.

FIG. 12 shows the region according to FIG. 11 after a further processing step. The residual oxide layer 12 on the top surface of the gate island 4 is etched. Due to the etching process, an upper region of the oxide line 11 is etched and adjacent regions of the nitride spacer are laterally etched, too. The insulation is not affected by the etching process due to the thickness of the oxide line 11 and the nitride spacer 8.

Figure 13:
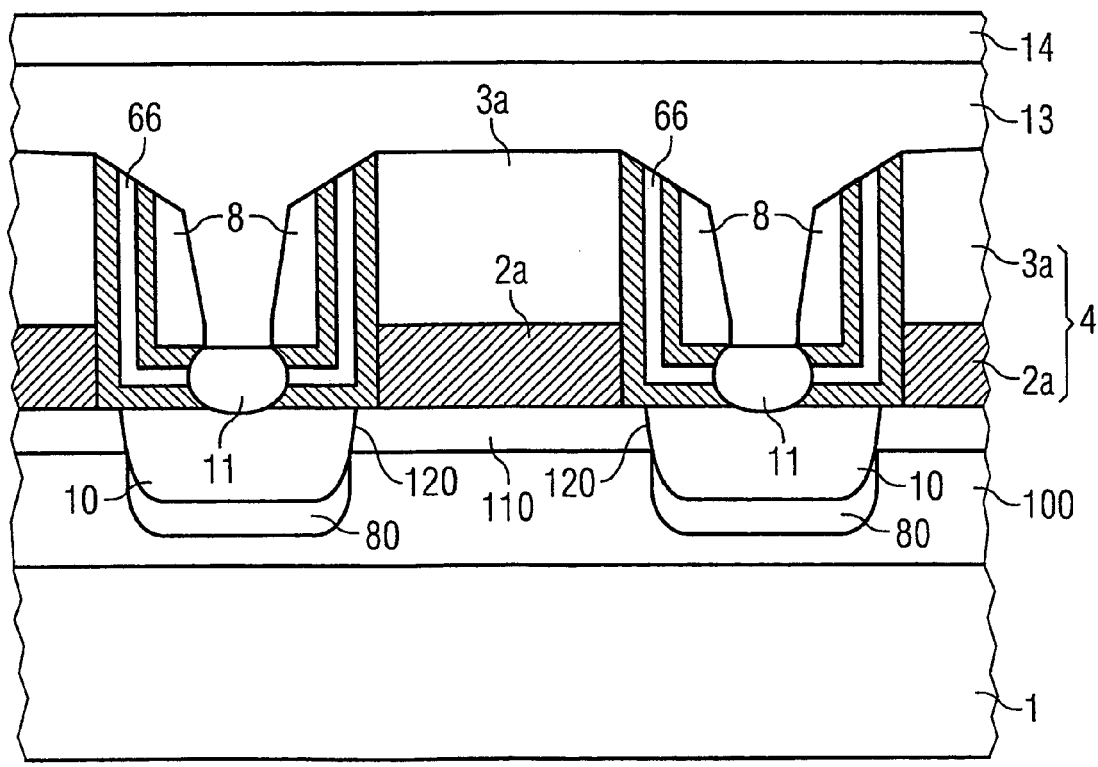
FIG. 13 shows a cross-section according to FIG. 12 after applying a wordline.

FIG. 13 shows the region according to FIG. 12 after a further processing step. A wordline 13 is formed by applying polysilicon with tungsten silicide. Alternatively, polysilicon and other metals or metal-silicides are used. The wordline 13 is connected with the gate electrodes 3a. Polysilicon with tungsten silicide is more conductive than pure polysilicon. Other suicides, such as titanium silicide, cobalt silicide, or nickel silicide, as example, can alternatively be used. Nevertheless, the gate electrodes 3a may include polysilicon, which is more robust to the etching process of the gate islands 4. The semiconductor region is covered by a cap nitride layer 14 for protection.

Figure 14:
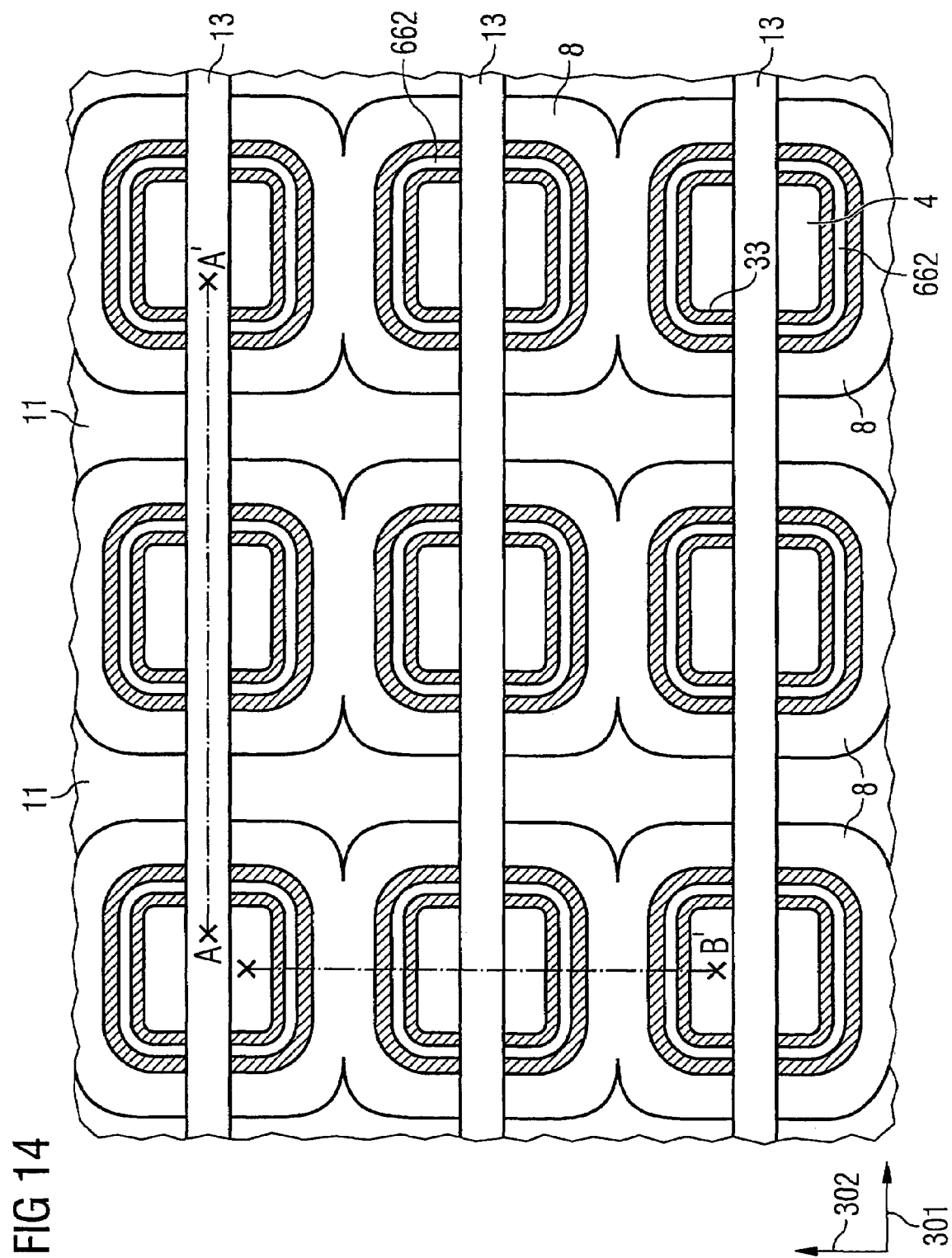
FIG. 14 shows the structure of the cell array in the top view.

FIG. 14 shows a top view of the cells according to FIG. 4 after further processing steps, which have been described above. Vertical portions 662 of the ONO layer 66 are located on the sidewalls 33 of the gate islands 4. The nitride spacer 8 is located on the vertical portions 662 of the ONO layer 66 forming sidewalls of trenches 40, which are arranged parallel to the second direction 302. The oxide lines 11 above the bitlines 10 are located between adjacent columns of gate islands 4.

Writing, erasing or reading of each cell is performed by applying the corresponding drive voltage to the bitlines and the wordline, which are connected with the respective cell.

The above-described preferred fabrication steps also describes the preferred embodiment of the inventive cell.

A further step, which is not shown here, comprises inserting a metal contact into the buried bitline 10 without connecting with the gate electrode 3a. A step of adjusting the position of the metal contact is relaxed due to the thickness of the insulating nitride spacer 8 located around the gate electrode 3a.

Figure 15:
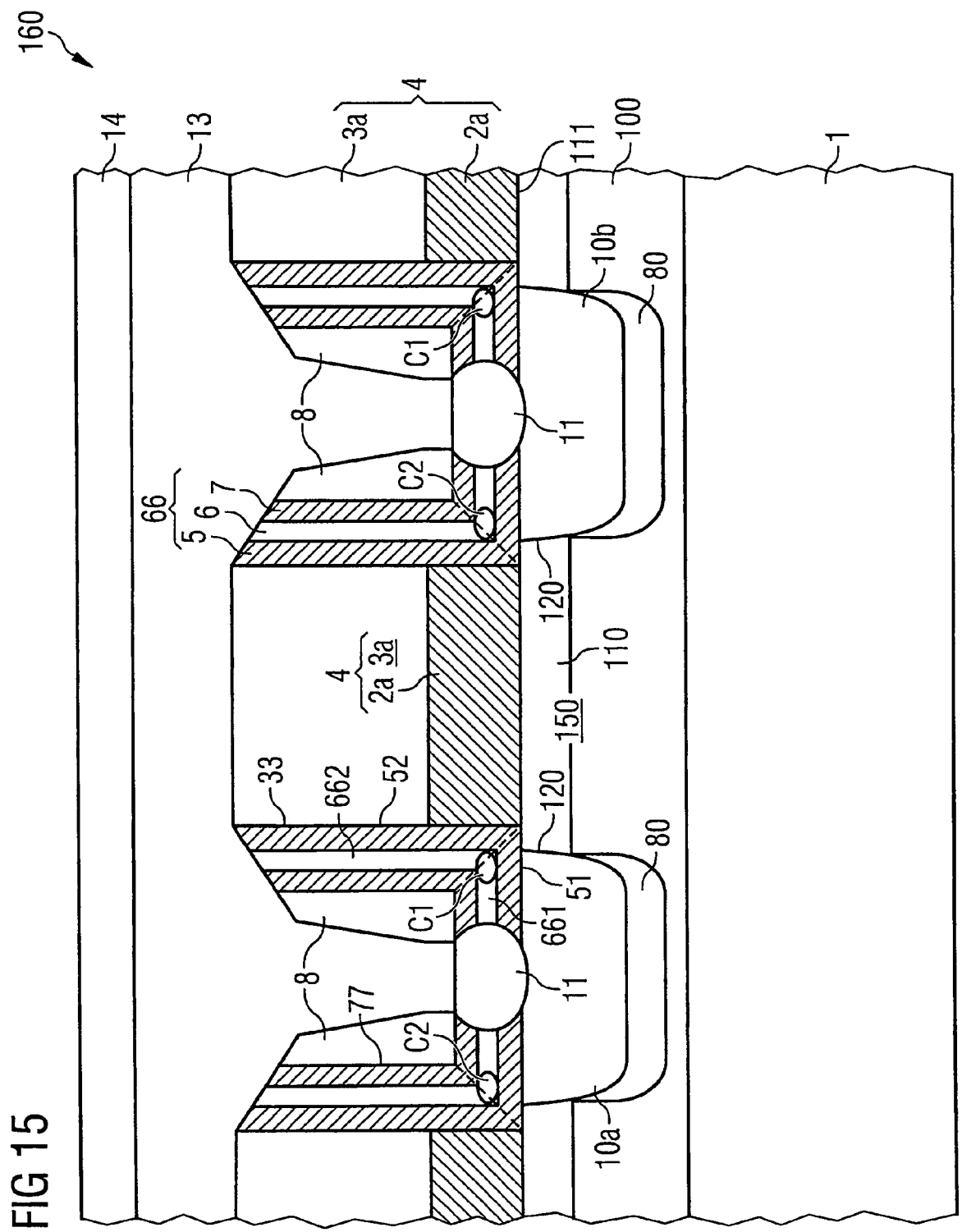
FIG. 15 shows a cross-section of the inventive cell structure.

FIG. 15 shows a cross-section of a memory cell 160 array having rows and columns. The cross-section of memory cells 160 arranged in the row is according to line AA' (see FIG. 14), which is orientated parallel to the first direction 301. A memory cell 160 and parts of adjacent memory cells 160 on either side are shown.

The memory cell 160 includes a transistor body 150 having a top surface 111. There is a cell well 100 beneath the top surface 111 that includes a first doping area 10a and a second doping area 10b with a channel region 110 in between. A gate electrode 3a is arranged above the channel region 110 and separated therefrom by a gate dielectric 2a. The gate dielectric 2a comprises for example silicon dioxide. A bitline 10 connects the first doping areas 10a or the second doping areas 10b, which are arranged in a column parallel to the second direction 302. Only the first and second doping areas 10a, 10b are shown, since the bitlines 10 are orientated normal to the cross-section. The optional anti-punch implant 80 described above is also shown in FIG. 15. It is located beneath the top surface between the gate islands 4, located beneath and around the first and second doping areas 10a, 10b.

An oxide-nitride-oxide (ONO) layer 66 is arranged above the top surface 111 of the transistor body 150 and the sidewalls 33 of the gate electrode 3a. The ONO layer 66 comprises a nitride layer 6, which is sandwiched between a top oxide layer 7 and a bottom oxide layer 5. The nitride layer 6 comprises, for example, silicon nitride. Instead of silicon nitride, any non-conductive charge-trapping material can be used.

The ONO layer 66 comprises first portions 661 and second portions 662. The first portions 661 of the ONO layer 66 are substantially parallel to the top surface 111 of the transistor body 150. Bottom surfaces 51 of the first portions 661 of the ONO layer 66 are in contact with the top surface 111 of the transistor body 150. The second portions 662 of the ONO layer 66 are adjacent to the gate island 4 and extend in a direction not substantially parallel to the top surface 111 of the transistor body 150. In particular, the second portions 662 of the ONO layer 66 are substantially vertical to the top surface 111 of the transistor body 150. Bottom surfaces 52 of the second portions 662 of the ONO layer 66 are in contact with sidewalls 33 of the gate island 4.

The L-shaped ONO layer 66 comprises a corner region of the nitride layer 6, which is preferably located above a junction area 120 located between one of the first and second doping areas 10a, 10b and the channel region 110. The corner region serves as a charge-trapping region of the memory cell 160. There are charge-trapping regions C1, C2 on either side of the gate island 4. There is no direct nitride connection between the charge-trapping regions C1, C2 of one memory cell 160.

The first portions 661 of the ONO layer 66 are above the first and second doping areas 10a, 10b. They are separated by the oxide line 11 that is located above the bitline 10.

The L-shaped ONO layer 66 has a top surface 77 that is covered by a nitride layer forming a vertical nitride spacer 8, which serves as a means of insulating adjacent gate electrodes 3a.

A wordline 13 connects the gate electrodes 3a arranged in a row. The semiconductor region is covered by a cap nitride layer 14 for protection.

For programming, reading or erasing a memory cell 160, the respective drive voltages have to be applied to the bitlines 10 and the wordline 13, which are connected with the respective memory cell 160. The method of programming a first bit and a second bit and the erasing and the reading of the respective bits has already been described in the section on the state of the art. Special features of the inventive memory cell 160 with respect to programming, reading and erasing are described below.

One of the first and second doping areas 10a, 10b serves as a drain and the other one serves as a source. For programming a first bit, programming voltages are applied to the bitline 10 connecting the first doping area 10a and the wordline 13 connecting the gate electrode 3a of the respective memory cell 160. The bitline 10 connecting the second doping area 10b is grounded. As a result, electrons are injected into the first charge-trapping area C1 adjacent to the first doping area 10a.

Likewise, applying corresponding programming voltages to the second doping area 10b and the gate electrode 3a results in injecting electrons into the second charge-trapping area C2 adjacent to the second doping area 10b.

Reading and erasing of the first and second bit comprises the steps that are described in the section on the state of the art.

Due to the separation of the first and the second charge-trapping areas C1, C2, the interference effects that occur during reading, programming or erasing are mitigated. Due to the lack of a nitride layer beneath the gate electrode 3a, charges, especially holes, cannot move into the channel region 110 below the gate electrode 3a. Thus, spontaneous injection into the ONO layer 66 becomes more unlikely. Residual charges in the nitride layer 6, especially holes, move upwards, which means that they hardly influence the cell.

What is claimed is:

1. A semiconductor device comprising:
   a transistor body having a top surface and having a first doping area and a second doping area, and a channel region between the first doping area and the second doping area;
   a gate dielectric located over the top surface of the transistor body;
   a gate electrode disposed above the channel region and disposed on the gate dielectric such that the gate dielectric is located between the gate electrode and the top surface of the transistor body;
   a first portion of an oxide-nitride-oxide layer disposed above the first and second doping areas and the first portions of the oxide-nitride-oxide layer having a first surface substantially parallel to the top surface of the transistor body and said first portion further including a second surface;
   a second portion of the oxide-nitride-oxide layer extending in a direction not substantially parallel to the top surface of the transistor body and said second portion having a first surface located adjacent to the gate electrode and said second portion also having a second surface; and
   a nitride spacer for insulating said gate electrode arranged vertical with respect to the top surface of the transistor body and located on the second surface of said first and second portions.

2. The semiconductor device according to claim 1, wherein the second portions of the oxide-nitride-oxide layer extend substantially orthogonal with respect to the first portions of the oxide-nitride-oxide layer.

3. The semiconductor device according to claim 1, wherein the first surfaces of the first portions of the oxide-nitride-oxide layer are in contact with the top surface of the transistor body, and the first surfaces of the second portions of the oxide-nitride-oxide layer are in contact with sidewalls of the gate electrode.

4. The semiconductor device according to claim 1, wherein the gate electrode comprises polysilicon.

5. The semiconductor device according to claim 1, wherein the gate dielectric layer comprises one of silicon dioxide or silicon oxide.

6. The semiconductor device according to claim 1, wherein the channel region is doped with a dopant comprising either boron and/or indium, and wherein the first and second doping areas are doped with arsenic.

7. The semiconductor device according to claim 1, further comprising a plurality of memory cells, the memory cells being arranged in a matrix having columns and rows, the rows aligned to a first direction, the columns aligned to a second direction, the second direction orthogonal with respect to the first direction.

8. The semiconductor device according to claim 7, wherein a subset of the first and second doping areas of the plurality of the memory cells arranged in the same one of rows is aligned with a line parallel to the first direction.

9. The semiconductor device according to claim 7, wherein the second portions of the oxide-nitride-oxide layer extend substantially orthogonal with respect to the first portions of the oxide-nitride-oxide layer.

10. The semiconductor device according to claim 7, wherein the first surfaces of the first portions of the oxide-nitride-oxide layer are in contact with the top surface of the transistor body, and the first surfaces of the second portions of the oxide-nitride-oxide layer are in contact with sidewalls of the gate electrode.

11. The semiconductor device according to claim 7, wherein the gate electrode comprises polysilicon.

12. The semiconductor device according to claim 7, wherein the dielectric layer comprises one of silicon dioxide or silicon oxide.

13. The semiconductor device according to claim 7, wherein the channel region is doped with a dopant, said dopant comprising one of boron and/or indium, and wherein the first and second doping areas are doped with arsenic.

14. The semiconductor device according to claim 7, further comprising dopants having anti-punch characteristics disposed between adjacent rows of gate electrodes and extending parallel to the first direction, the dopants being located beneath the top surface of the transistor body.

15. The semiconductor device according to claim 7, further comprising a bitline disposed parallel to the second direction, the bitline electrically coupling at least two adjacent doping areas located parallel to the second direction.

16. The semiconductor device according to claim 15, further comprising an oxide line disposed on the bitline, the oxide line disposed between the first portions of the oxide-nitride-oxide layer.

17. The semiconductor device according to claim 7, further comprising a wordline, the wordline electrically connected to at least two of a multitude of gate electrodes arranged in a same one of the rows.

18. The semiconductor device according to claim 17, wherein the wordline comprises one or more materials selected from the group consisting of polysilicon, metal and metal suicide.

19. The semiconductor device according to claim 18 wherein the wordline comprises tungsten silicide.

20. The semiconductor device of claim 1:
    wherein the transistor body is formed in a substrate having a top surface;

wherein the gate electrode is one of a multitude of gate electrodes disposed on the top surface of the substrate, the gate electrodes disposed in an array having rows located parallel to a first direction and columns located parallel to a second direction, which is orthogonal with respect to the first direction;

wherein the gate dielectric is one of a multitude of gate dielectrics;

wherein the first doping area and the second doping area are part of a first bitline and a second bitline, respectively, the first and second bitlines disposed along the second direction on either side of a column of the gate electrodes, the bitlines buried beneath the top surface of the substrate; and wherein the a channel region is disposed in the substrate between the bitlines and beneath the gate electrode.

21. The semiconductor device according to claim 20, wherein the second portions of the oxide-nitride-oxide layer extend substantially orthogonal with respect to the first portions of the oxide-nitride-oxide layer.

22. The semiconductor device according to claim 20, wherein the first surfaces of the first portions of the oxide-nitride-oxide layer are in contact with the top surface of the substrate, and the first surfaces of the second portions of the oxide-nitride-oxide layer are in contact with sidewalls of the gate electrode.

23. The semiconductor device according to claim 20, wherein the gate electrodes comprise polysilicon.

24. The semiconductor device according to claim 20, wherein the gate dielectric comprises one of silicon dioxide or silicon oxide.

25. The semiconductor device according to claim 20, wherein the channel region is doped with boron and/or indium; and wherein the first and second doping areas are doped with arsenic.

26. The semiconductor device according to claim 20, further comprising dopants having anti-punch characteristics disposed between adjacent rows of gate electrodes and extending parallel to the first direction, the dopants located beneath the top surface of the substrate.

27. The semiconductor device according to claim 20, further comprising at least two oxide lines, each disposed on one of the bitlines, each oxide line disposed between the first portions of the oxide-nitride-oxide layer.

28. The semiconductor device according to claim 20, further comprising a wordline that is electrically connected to at least two of the multitude of gate electrodes arranged in a same one of the rows.

29. The semiconductor device according to claim 28, wherein the wordline comprises one or more materials selected from the group consisting of polysilicon, metal and metal silicide.

30. The semiconductor device of claim 1 further comprising an oxide line separating first portions of said oxide-nitride-oxide layer.

31. The semiconductor device of claim 30 further comprising a bit line below said oxide line.

* * * * *

UNITED STATES PATENT AND TRADEMARK OFFICE
CERTIFICATE OF CORRECTION

| | |
|---|---|
| PATENT NO. | : 7,238,974 B2 |
| APPLICATION NO. | : 10/978216 |
| DATED | : July 3, 2007 |
| INVENTOR(S) | : Strassburg et al. |

It is certified that error appears in the above-identified patent and that said Letters Patent is hereby corrected as shown below:

Title Page, Item (56), Col. 2, line 2, delete "2004/0028733" and insert --2004/0026733--.
In Col. 9, line 41, delete "suicides," and insert --silicides,--.
In Col. 12, line 62, delete "suicide." and insert --silicide.--.
In Col. 13, line 15, delete "the a channel" and insert --the channel--.

Signed and Sealed this

Eighteenth Day of September, 2007

JON W. DUDAS
*Director of the United States Patent and Trademark Office*